United States Patent
Jak et al.

(10) Patent No.: US 10,162,272 B2
(45) Date of Patent: Dec. 25, 2018

(54) METROLOGY METHOD AND APPARATUS, SUBSTRATES FOR USE IN SUCH METHODS, LITHOGRAPHIC SYSTEM AND DEVICE MANUFACTURING METHOD

(71) Applicant: ASML NETHERLANDS B.V., Veldhoven (NL)

(72) Inventors: Martin Jacobus Johan Jak, 's-Hertogenbosch (NL); Hendrik Jan Hidde Smilde, Veldhoven (NL); Te-Chih Huang, Hsinchu (TW); Victor Emanuel Calado, Rotterdam (NL); Henricus Wilhelmus Maria Van Buel, 's-Hertogenbosch (NL); Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 28 days.

(21) Appl. No.: 15/240,781

(22) Filed: Aug. 18, 2016

(65) Prior Publication Data
US 2017/0052454 A1  Feb. 23, 2017

(30) Foreign Application Priority Data

Aug. 20, 2015 (EP) .................................. 15181751
Mar. 8, 2016 (EP) .................................. 16159077

(51) Int. Cl.
*G06F 7/20* (2006.01)
*G03F 7/20* (2006.01)

(52) U.S. Cl.
CPC ........ *G03F 7/7065* (2013.01); *G03F 7/70633* (2013.01); *G03F 7/70683* (2013.01)

(58) Field of Classification Search
CPC . G03F 7/70633; G03F 7/7065; G03F 7/70683
See application file for complete search history.

(56) References Cited

U.S. PATENT DOCUMENTS 8,339,595 B2   12/2012 Den Boef
8,363,220 B2 *  1/2013 Coene ................. G03F 7/70633
                                              356/399

(Continued)

FOREIGN PATENT DOCUMENTS

WO    2009/078708    6/2009
WO    2009/106279    9/2009

(Continued)

OTHER PUBLICATIONS

International Search Report and Written Opinion dated Nov. 11, 2016 in corresponding International Patent Application No. PCT/EP2016/068426.

*Primary Examiner* — Steven H Whitesell Gordon
(74) *Attorney, Agent, or Firm* — Pillsbury Winthrop Shaw Pittman LLP

(57) ABSTRACT

A substrate has a plurality of overlay gratings formed thereon by a lithographic process. Each overlay grating has a known overlay bias. The values of overlay bias include for example two values in a region centered on zero and two values in a region centered on P/2, where P is the pitch of the gratings. Overlay is calculated from asymmetry measurements for the gratings using knowledge of the different overlay bias values, each of the overall asymmetry measurements being weighted by a corresponding weight factor. Each one of the weight factors represents a measure of feature asymmetry within the respective overlay grating. The calculation is used to improve subsequent performance of the measurement process, and/or the lithographic process. Some of the asymmetry measurements may additionally be (Continued)

weighted by a second weight factor in order to eliminate or reduce the contribution of phase asymmetry to the overlay.

23 Claims, 8 Drawing Sheets

(56) References Cited

U.S. PATENT DOCUMENTS

| | | |
|---|---|---|
| 8,411,287 B2 | 4/2013 | Smilde et al. |
| 8,867,020 B2 | 10/2014 | Smilde et al. |
| 9,081,303 B2 | 7/2015 | Cramer et al. |
| 9,110,395 B2 | 8/2015 | Den Boef |
| 9,134,256 B2 | 9/2015 | Smilde et al. |
| 2004/0038455 A1 | 2/2004 | Seligson et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2012/0044470 A1 | 2/2012 | Smilde et al. |
| 2012/0242970 A1 | 9/2012 | Smilde et al. |
| 2013/0035888 A1 | 2/2013 | Kandel et al. |
| 2013/0258310 A1 | 10/2013 | Smilde et al. |
| 2013/0278942 A1 | 10/2013 | Jeong et al. |
| 2015/0145151 A1 | 5/2015 | Van Der Schaar et al. |
| 2015/0177135 A1 | 6/2015 | Amit et al. |
| 2016/0061589 A1 | 3/2016 | Bhattacharyya et al. |
| 2016/0161863 A1 | 6/2016 | Den Boef et al. |

FOREIGN PATENT DOCUMENTS

| | | |
|---|---|---|
| WO | 2011/012624 | 2/2011 |
| WO | 2013/143814 | 10/2013 |
| WO | 2015/078669 | 6/2015 |

\* cited by examiner

METROLOGY METHOD AND APPARATUS, SUBSTRATES FOR USE IN SUCH METHODS, LITHOGRAPHIC SYSTEM AND DEVICE MANUFACTURING METHOD

This application claims the benefit of priority of European Patent Application No. 15181751.7, which was filed on Aug. 20, 2015, and of European Patent Application No. 16159077.3, which was filed on Mar. 8, 2016, each of which are incorporated herein in its entirety by reference.

FIELD

The present description relates to methods and apparatus for metrology usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279 which documents are hereby incorporated by reference in their entirety. Further developments of the technique have been described in U.S. patent application publications US 2011-0027704, US 2011-0043791 and US 2012-0242970, the entire contents of all these applications are also incorporated herein by reference. Diffraction-based overlay using dark-field detection of the diffraction orders enables overlay measurements on smaller targets. These targets can be smaller than the illumination spot and may be surrounded by product structures on a substrate. Multiple targets can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error.

SUMMARY

Although the known dark-field image-based overlay measurements are fast and computationally very simple (once calibrated), they rely on an assumption that overlay is the only cause of asymmetry in the target structure. Any other asymmetry in the stack, such as asymmetry of features within one or both of the overlaid gratings, also causes an asymmetry in the $1^{st}$ orders. This asymmetry which is not related to the overlay clearly perturbs the overlay measurement, giving an inaccurate overlay result. Asymmetry in the bottom grating of the overlay grating is a common form of feature asymmetry. It may originate for example in substrate processing steps such as chemical-mechanical polishing (CMP), performed after the bottom grating was originally formed.

Accordingly at this time the skilled person has to choose between, on the one hand, a simple and fast measurement process that gives overlay measurements but is subject to inaccuracies when other causes of asymmetry are present, and on the other hand more traditional techniques that are computationally intensive and typically require several measurements of large, underfilled gratings to avoid that the pupil image is polluted with signal from the environment of the overlay grating, which hampers the reconstruction on this.

Therefore, it is desired to distinguish the contributions to target structure asymmetry that are caused by overlay and other effects in a more direct and simple way.

It is desirable, for example, to provide a method and apparatus for overlay metrology using target structures, in which throughput and accuracy can be improved over prior published techniques. Furthermore, although not limited to this, it would be of great advantage, if this could be applied to small target structures that can be read out with the dark-field image-based technique.

In a first aspect, there is provided a method of measuring a parameter of a lithographic process, the method comprising: (a) using the lithographic process to form a target with a plurality of target structures on a substrate, each target structure comprising overlaid periodic structures and each having a known overlay bias; (b) illuminating the target structures and detecting radiation scattered by each target structure to obtain for that target structure a measurement representing an overall asymmetry that includes contributions due to (i) the known overlay bias, (ii) overlay performance of the lithographic process, and (iii) feature asymmetry within one or more of the periodic structures; (c) using the overall asymmetry measurements for a plurality of target structures to calculate a measure of the overlay error, the calculation being performed using the known overlay bias values and the overall asymmetry measurements, wherein each of the overall asymmetry measurements is weighted by a corresponding weight factor, each one of the weight factors representing a measure of feature asymmetry within the respective one or more periodic structures.

In some embodiments, at least four different values of overlay bias are used, comprising at least two bias values falling within a first region centered on zero bias and at least two bias values falling within a second region centered on P/2 where P is the pitch of the periodic structure.

The bias values falling within the first region centered on zero bias may be weighted by a first weight factor, and the bias values falling within the second region centered on P/2 may be weighted by a second weight factor.

In some embodiments, the method may comprise determining a ratio between the first weight factor and the second weight factor based on the overall asymmetry measurements, wherein the ratio is based on the feature asymmetry of the first region and the feature asymmetry of the second region.

Two different values of overlay bias may be used on at least one target structure of the plurality of target structures, the two bias values falling within the half period centered on zero bias.

In some embodiments, each target structure comprises a first periodic structure and a second periodic structure, and wherein each of the corresponding weight factors is based on a ratio between a first diffraction efficiency of the first periodic structure and a second diffraction efficiency of the second periodic structure of the target structure.

In some embodiments, the method may comprise: determining an overlay value based on the overall asymmetry measurements and a second weight factor, wherein the overall asymmetry measurement for at least one of the target structures is weighted by the second weight factor, and wherein the second weight factor has a specific value; repeating the determining step for a plurality of values of the second weight factor; and selecting one of the plurality of values of the second weight factor based on the determined overlay values and one or more reference values.

The overall asymmetry for at least one target structure having an overlay bias value falling within the first region may be weighted.

In some embodiments, the step of selecting may comprise: deriving a difference between each of the plurality of determined overlay values and each of the one or more reference values; and selecting the value of the second weight factor corresponding to the determined overlay value having the smallest derived difference from the one or more reference values.

The step of illuminating may comprise illuminating the target structures using a plurality of radiation wavelengths to create a plurality of overlay data sets, each overlay data set comprising a plurality of determined overlay values corresponding to a specific illumination wavelength.

The step of deriving may in some embodiments additionally comprise deriving the difference between each of the plurality of determined overlay values of a first overlay data set corresponding to a first illumination wavelength and each of the plurality of determined overlay values of a second overlay data set corresponding to a second illumination wavelength.

In some embodiments, this deriving step may be repeated for a plurality of overlay data sets corresponding to a plurality of specific illumination wavelengths.

In a second aspect, there is provided an inspection apparatus for measuring a parameter of a lithographic process, the apparatus comprising: a support for a substrate having a plurality of target structures thereon, each target structure comprising overlaid periodic structures and each having a known overlay bias; an optical system for illuminating the target structures and detecting radiation scattered by each target structure to obtain for that target structure a measurement representing an overall asymmetry that includes contributions due to (i) the known overlay bias, (ii) overlay performance of the lithographic process, (iii) feature asymmetry within one or more of the periodic structures; a processor arranged to use the overall asymmetry measurements for a plurality of target structures to calculate a measure of the overlay error, the calculation being performed using the known overlay bias values and the overall asymmetry measurements, wherein each of the overall asymmetry measurements is weighted by a corresponding weight factor, each one of the weight factors representing a measure of feature asymmetry within the respective one or more periodic structures.

There is further provided a substrate for use in a method or apparatus as described herein.

There is further provided a patterning device for use in forming a substrate according to any aspect described herein.

There is further provided a computer program product comprising machine-readable instructions for causing a processor to perform the processing step (c) of a method as set forth above.

There is further provided a lithographic system comprising: a lithographic apparatus comprising: an illumination optical system arranged to illuminate a pattern, and a projection optical system arranged to project an image of the pattern onto a substrate; and an inspection apparatus as set forth herein, wherein the lithographic apparatus is arranged to use one or more parameters calculated by the inspection apparatus in applying the pattern to further substrates There is further provided a method of manufacturing devices wherein a device pattern is applied to a series of substrates using a lithographic process, the method including inspecting at least one periodic structure formed as part of or beside the device pattern on at least one of the substrates using a method as described herein and controlling the lithographic process for later substrates in accordance with the result of the inspection method Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
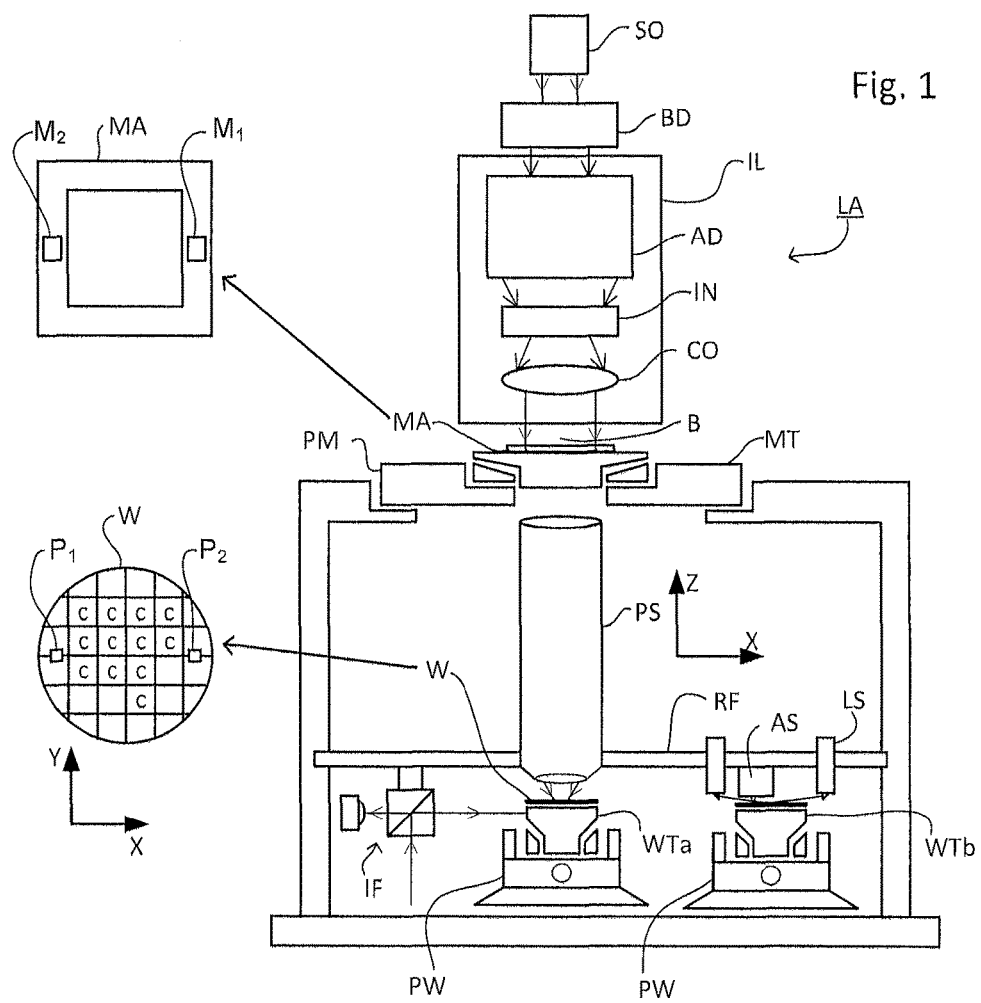
FIG. 1 depicts a lithographic apparatus according to an embodiment.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of embodiments of the present invention.

Figure 2:
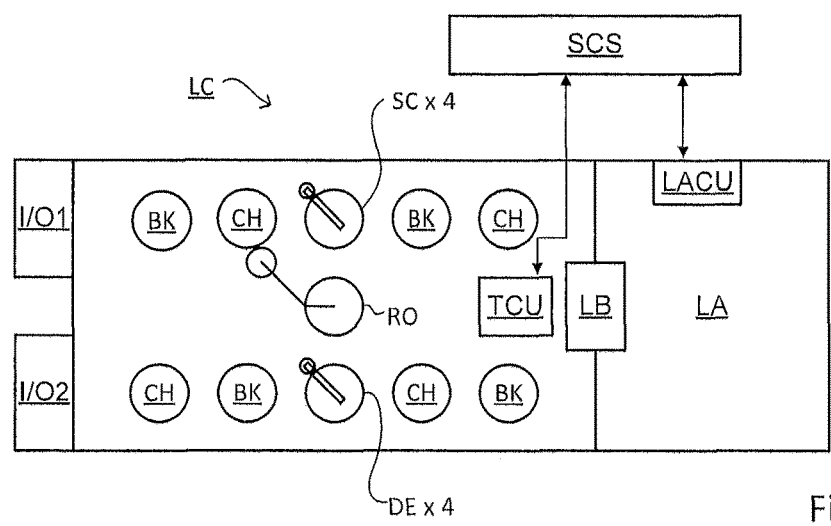
FIG. 2 depicts a lithographic cell or cluster according to an embodiment.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
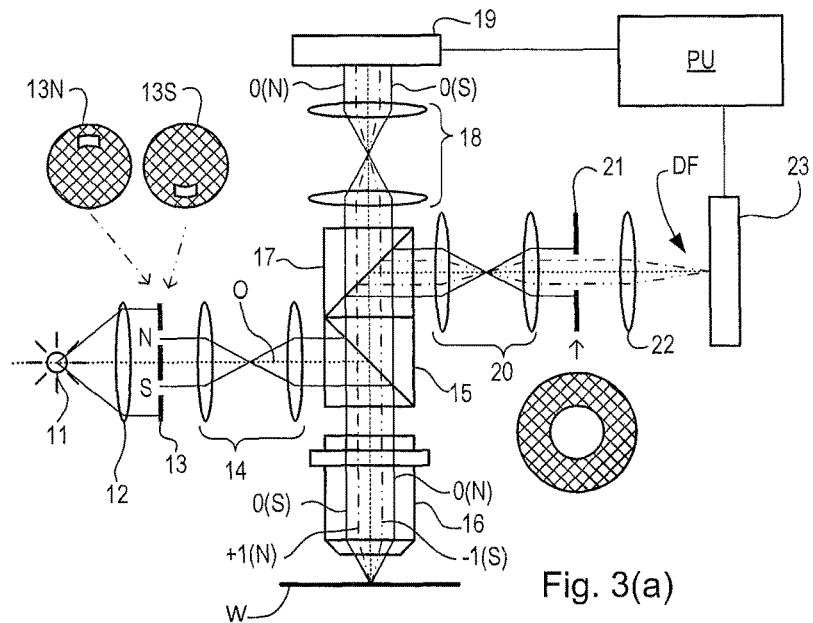
FIG. 3(a) comprises a schematic diagram of a dark field scatterometer for use in measuring targets according to embodiments using a first pair of illumination apertures.

A dark field metrology apparatus suitable for use in embodiments is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figure 3B:
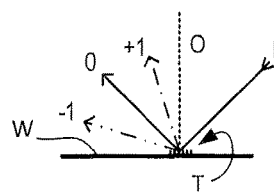
FIG. 3(b) schematically depicts a detail of diffraction spectrum of a target grating for a given direction of illumination.
Figure 3C:
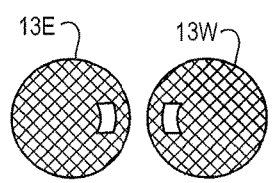
FIG. 3(c) schematically depicts a second pair of illumination apertures providing further illumination modes in using the scatterometer for diffraction based overlay measurements.
Figure 3D:
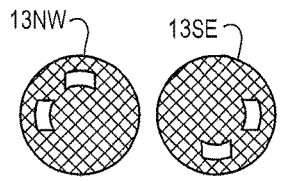
FIG. 3(d) schematically depicts a third pair of illumination apertures combining the first and second pair of apertures.

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of radiation, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(*a*) and 3(*b*) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1 (N), enter the objective lens 16. In contrast, when the second illumination mode is applied using aperture plate 13S the −1 diffracted rays (labeled −1 (S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(*c*) and (*d*). The use of these, and numerous other variations and applications of the apparatus are described in prior published applications, mentioned above.

Figure 4:
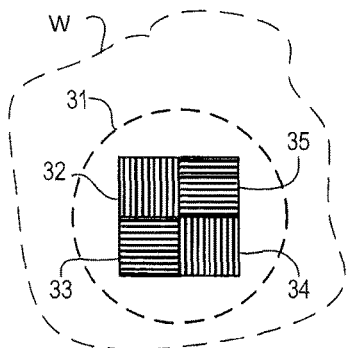
FIG. 4 depicts a form of multiple grating target and an outline of a measurement spot on a substrate.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23.

Figure 5:
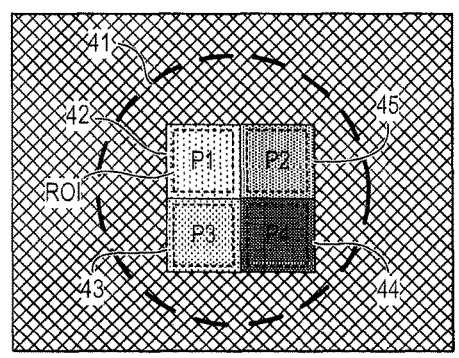
FIG. 5 depicts an image of the target of FIG. 4 obtained in the scatterometer of FIG. 3.

FIG. 5 shows an example of an image that may be formed on and detected by the sensor 23, using the target of FIG. 4 in the apparatus of FIG. 3, using the aperture plates 13NW or 13SE from FIG. 3(*d*). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
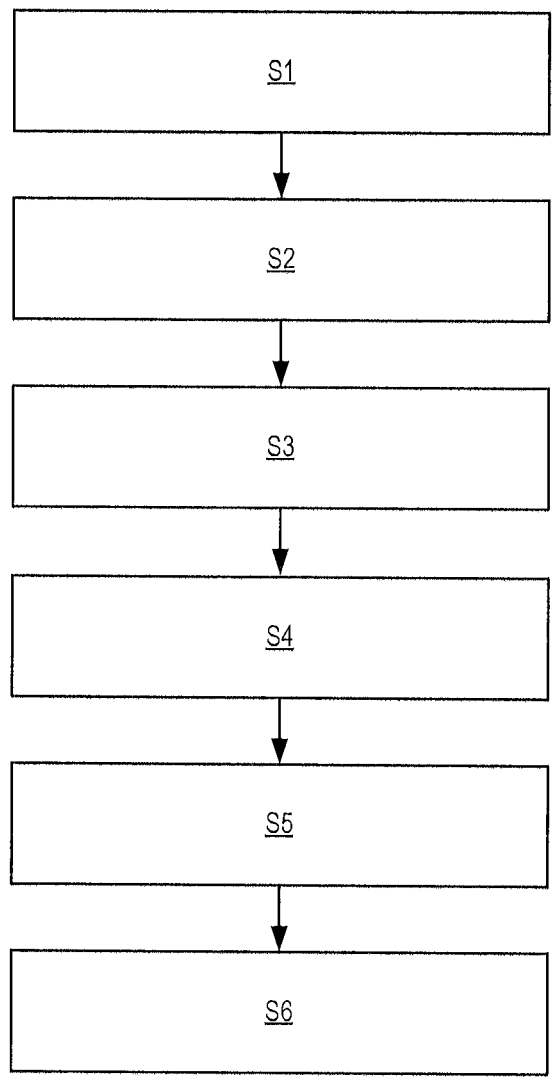
FIG. 6 is a flowchart showing an overlay measurement method using the scatterometer of FIG. 3 and adaptable to form an embodiment of a method, comprising: processing the substrate using a lithography apparatus to produce gratings on the substrate; measuring $-1^{st}$ order scatterometry image using $1^{st}$ illumination mode; measuring $+1^{st}$ order scatterometry image using $1^{st}$ illumination mode; recognizing and extracting each grating region of interest from each image; calculating a difference image of each grating to determine asymmetry; and using grating asymmetries to determine overlay or one or more other performance parameters.

FIG. 6 illustrates how, using for example the method described in application PCT patent application publication no. WO 2011/012624, which is incorporated herein in its entirety by reference, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is identified within the image of each component grating, from which intensity levels will be measured.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity. The term "difference" is not intended to refer only to subtraction. Differences may be calculated in ratio form. In step S6 the measured asymmetries for a number of gratings are used together with knowledge of the overlay biases of those gratings to calculate one or more performance parameters of the lithographic process in the vicinity of the target T. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be further described.

FIG. 7 shows schematic cross sections of overlay gratings, with different biases. These can be used as the target T on substrate W, as seen in FIGS. 3 and 4. Gratings with periodicity in the X direction are shown for the sake of example only. Different combinations of these gratings with different biases and with different orientations can be provided separately or as part of a composite target.

Figure 7A:
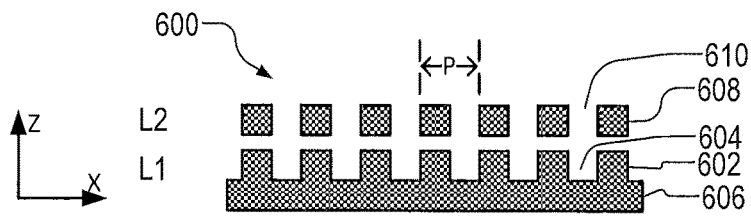
FIG. 7(a), FIG. 7(b) and FIG. 7(c) show schematic cross-sections of overlay gratings having different overlay values in the region of zero.

Starting with FIG. 7(a), there is schematically shown an overlay grating 600 formed in two layers, labeled L1 and L2. In the bottom layer L1, a grating is formed by lines 602 and spaces 604 on a substrate 606. In layer L2 a second grating is formed by lines 608 and spaces 610. (The cross-section is drawn such that the lines 602, 608 extend into the page.) The grating pattern repeats with a pitch P in both layers. Lines 602 and 608 are mentioned for the sake of example only, other types of features such as dots, blocks and via holes can all be used. In the situation shown at FIG. 7(a), there is no overlay error and no bias, so that each mark 608 lies exactly over a mark 602 in the bottom grating.

Figure 7B:
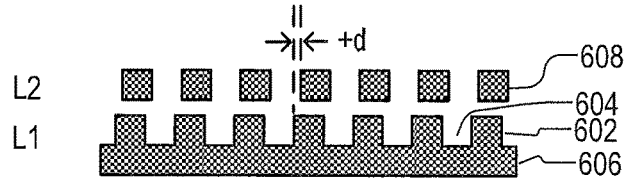
Figure 7C:
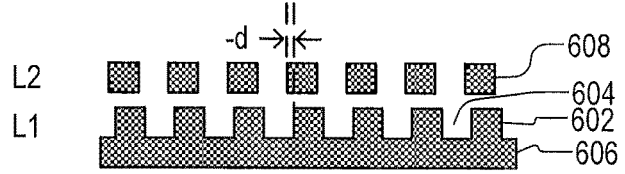

At FIG. 7(b), the same target is shown with a bias +d, such that the marks 608 of the upper grating are shifted by a distance d to the right, relative to the marks of the bottom grating. The bias distance d might be a few nanometers in practice, for example 10 nm-20 nm, while the pitch P is for example in the range 300-1000 nm, for example 500 nm or 600 nm. At FIG. 7(c), another target is shown with a bias −d, such that the marks 608 are shifted to the left. Biased targets of this type shown at FIG. 7(a) to 7(c) are known in the art, and described in the prior applications mentioned above.

Figure 7D:
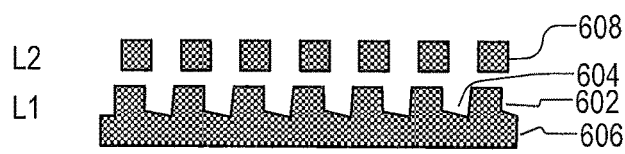
FIG. 7(d) is a schematic cross-section of an overlay grating having feature asymmetry in a bottom grating due to processing effects.

FIG. 7(d) shows schematically a phenomenon of bottom grating asymmetry. The features in the gratings at FIGS. 7(a) to (c), are shown as perfectly square-sided, when a real feature would have some slope on the side, and a certain roughness. Nevertheless they are intended to be at least symmetrical in profile. The marks 602 and/or spaces 604 at FIG. 7(d) in the bottom grating no longer have a symmetrical form at all, but rather have become distorted by one or more processing steps. Thus, for example, a bottom surface of each space has become tilted. Side wall angles of the lines and spaces have become asymmetrical also. When overlay is measured by the method of FIG. 6 using only two biased gratings, the process-induced asymmetry cannot be distinguished from overlay, and overlay measurements become unreliable as a result.

In PCT patent application publication no. WO 2013/143814 A1, mentioned above, the use of three or more component gratings was proposed to measure overlay by a modified version of the method of FIG. 6. Using three or more gratings of the type shown in FIGS. 7(a) to (c), there can be obtained overlay measurements that are to some extent corrected for feature asymmetry in the target gratings, such as is caused by bottom grating asymmetry in a practical lithographic process. However, if signals are noisy, it becomes difficult to make this correction. Furthermore, if a periodic relationship that is used as the basis of the calculation does not accurately model higher order harmonics present in the real target, additional errors can occur in the overlay measurement result.

Figure 7E:
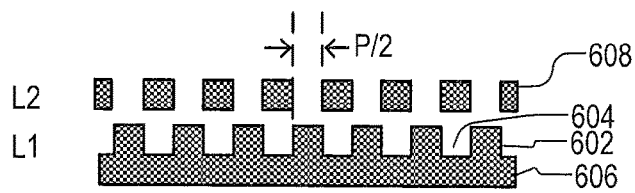
FIG. 7(e), FIG. 7(f) and FIG. 7(g) show schematic cross-sections of overlay gratings having different bias values in the region of a half pitch, as used in embodiments.

FIG. 7(e) shows a target with a programmed bias of P/2, that is half the pitch, such that each mark 608 in the upper grating lies exactly over a space 604 in the lower grating. At FIG. 7(f), a similar target is depicted, but with a small bias to the right (+d) added to the P/2 bias. At FIG. 7(g) we see a similar mark but with a bias to the left (−d) added to the bias P/2. Overlay gratings with bias in the region of P/2 are in themselves known. They are sometimes referred to as "line on trench" targets, while gratings with bias in the region of zero are referred to as "line on line" targets.

Figure 7F:
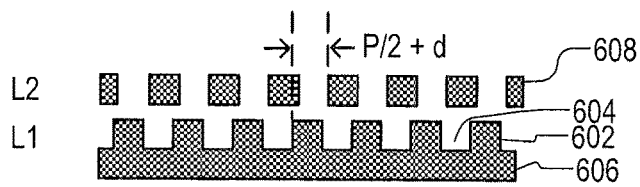
Figure 7G:
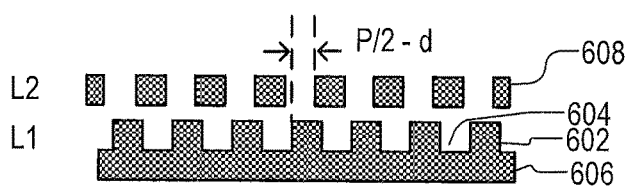
Figure 8:
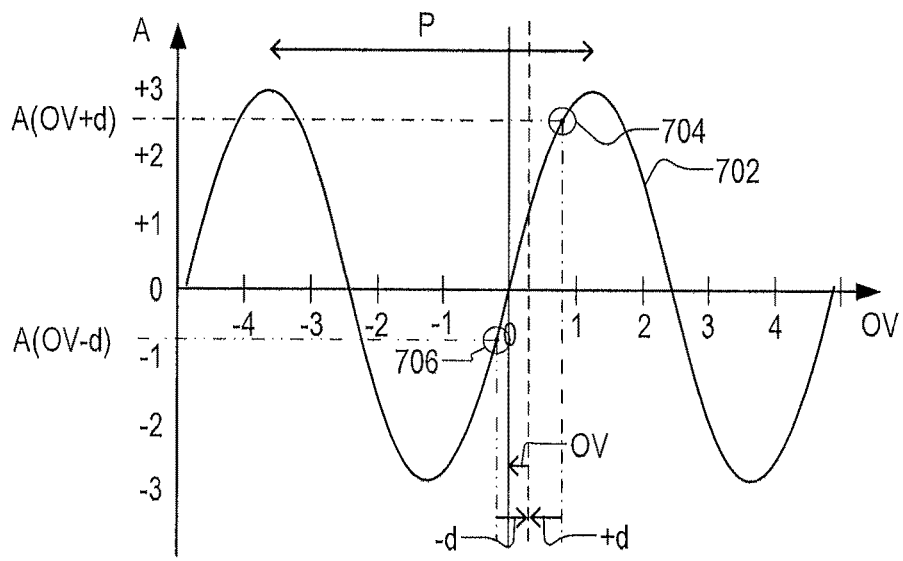
FIG. 8 illustrates principles of overlay measurement in an ideal target structure, not subject to feature asymmetry.
Figure 9:
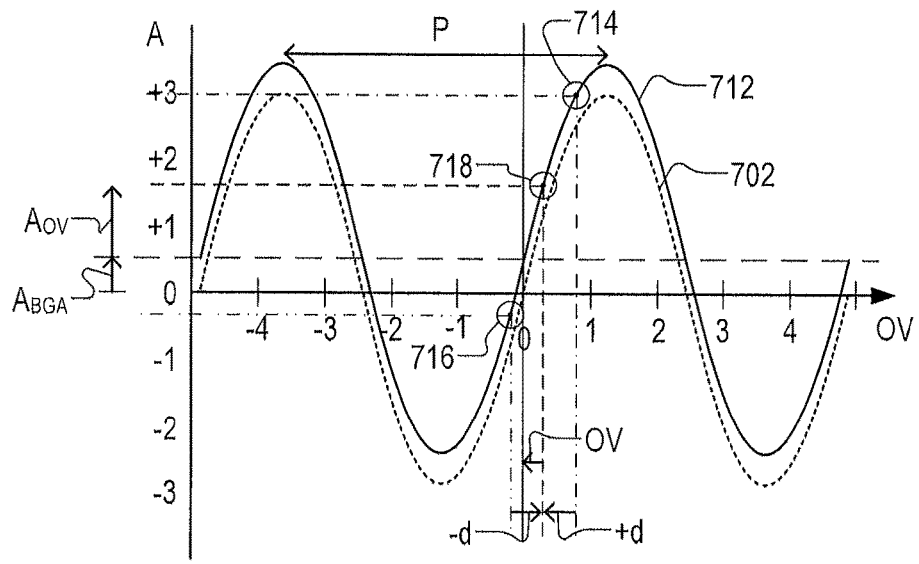
FIG. 9 illustrates a principle of overlay measurement in a non-ideal target structure, with correction of feature asymmetry as disclosed in PCT patent application publication no. WO 2013-143814.

Some of the examples described below use one or more of the P/2 biased gratings as shown at FIGS. 7(e), 7(f) and 7(g), to improve the robustness of the overlay measurement against a process-induced asymmetry, with greater noise immunity than the known techniques. Particular embodiments are further robust against higher-order harmonics in the periodic relationship between measured asymmetry and overlay error in the target. FIGS. 8 and 9 will be used to explain the prior techniques, and then FIG. 10 onward will show new techniques disclosed herein.

In FIG. 8 a curve 702 illustrates the relationship between overlay error OV and measured asymmetry A for an 'ideal' target having zero offset and no feature asymmetry within the individual gratings forming the overlay grating. These graphs are to illustrate the principles of embodiments only, and in each graph, the units of measured asymmetry A and overlay error OV are arbitrary. Examples of actual dimensions will be given further below.

In the 'ideal' situation of FIG. 8, the curve 702 indicates that the measured asymmetry A has a sinusoidal relationship with the overlay. The period P of the sinusoidal variation corresponds to the period (pitch) of the gratings, converted of course to an appropriate scale. The sinusoidal form is pure in this example, but can include harmonics in real circumstances. For the sake of simplicity, it is assumed in this example (a) that only first order diffracted radiation from the targets reaches the image sensor 23 (or its equivalent in a given embodiment), and (b) that the experimental target design is such that within these first orders a pure sine-relation exists between intensity and overlay between top and bottom grating results. Whether this is true in practice is a function of the optical system design, the wavelength of the illuminating radiation and the pitch P of the grating, and the design and stack of the target. In an embodiment where $2^{nd}$, $3^{rd}$ or higher orders also contribute to the intensities measured by sensor 23, the novel techniques to be described will help obtain an accurate overlay measurement.

As mentioned above, biased gratings can be used to measure overlay, rather than relying on a single measurement. This bias has a known value defined in the patterning device (e.g. a reticle) from which it was made, that serves as an on-substrate calibration of the overlay corresponding to the measured signal. In the drawing, the calculation is illustrated graphically. In steps S1-S5, asymmetry measurements A(+d) and A(−d) are obtained for component gratings having biases +d and −d respectively (as shown in FIGS. 7(b) and (c), for example). Fitting these measurements to the sinusoidal curve gives points 704 and 706 as shown. Knowing the biases, the true overlay error OV can be calculated. The pitch P of the sinusoidal curve is known from the design of the target. The vertical scale of the curve 702 is not known to start with, but is an unknown factor which we can call a $1^{st}$ harmonic proportionality constant, $K_1$.

In equation terms, the relationship between overlay and asymmetry is assumed to be:

$$A = K_1 \cdot \sin(OV) \quad (1)$$

where OV is expressed on a scale such that the grating pitch P corresponds to an angle $2\pi$ radians. Using two measurements of gratings with different, known biases one can solve two equations to calculate the unknowns $K_1$ and overlay OV.

FIG. 9 (taken from PCT patent application publication no. WO 2013/143814) shows a first effect of introducing feature asymmetry, for example the bottom grating asymmetry illustrated in FIG. 7(d). The 'ideal' sinusoidal curve 702 no longer applies. However, at least approximately, bottom grating asymmetry or other feature asymmetry has the effect of adding an offset to the asymmetry value A, which is relatively constant across all overlay values. The resulting curve is shown as 712 in the diagram, with label $A_{BGA}$ indicating the offset due to feature asymmetry. In equation terms, the relationship used for calculation in step S6 becomes:

$$A = K_0 + K_1 \cdot \sin(OV) \quad (2)$$

where the parameter $K_0$ describes the constant offset due to feature asymmetry.

By providing multiple gratings with a biasing scheme having three or more different bias values, the prior application seeks to obtain accurate overlay measurements by fitting the measurements to the off-set sine curve 712 and eliminating the constant.

Detailed examples of the modified measurement and calculations are given in the prior application for various different biasing schemes. For a simple example to illustrate the principle, FIG. 9 shows three measurement points 714, 716 and 718 fitted to the curve 712. The points 714 and 716 are measured from gratings having bias +d and −d, the same as for the points 704 and 706 in FIG. 7. A third asymmetry measurement from a grating with zero bias (in this example) is plotted at 718. Fitting the curve to three points allows the constant asymmetry value $A_{BGA}$ that is due to feature asymmetry to be separated from the sinusoidal contribution $A_{OV}$ that is due to overlay error, so that the overlay error can be calculated more accurately.

As noted already, the overlay calculations of modified step S6 rely on certain assumptions. Firstly, it is assumed that $1^{st}$ order intensity asymmetry due to the feature asymmetry (for example BGA) is independent of the overlay for the overlay range of interest, and as a result it can be described by a constant offset $K_0$. Another assumption is that intensity asymmetry behaves as a sine function of the overlay, with the period P corresponding to the grating pitch. The number of harmonics can be designed to be small, because the small pitch-wavelength ratio only allows for a small number of propagating diffraction orders from the grating. However, in practice the overlay contribution to the intensity asymmetry may not be only sinusoidal, and may not be symmetrical about OV=0.

Figure 10:
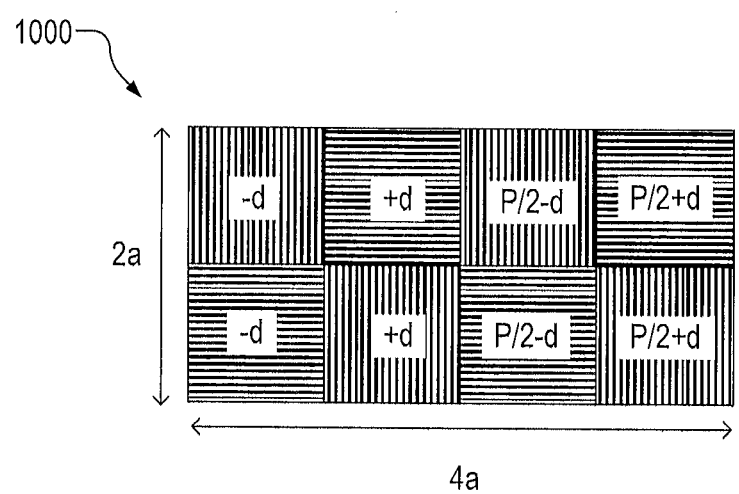
FIG. 10 illustrates a composite grating target having a bias scheme according to an embodiment.

FIG. 10 shows a first exemplary target 1000 which can be used to implement overlay measurement which takes into account variations in intensity asymmetry due to the feature asymmetry. The target of FIG. 10 has four target structures, e.g. gratings, periodic in X and four target structures periodic in Y, so that overlay in both directions can be measured. All of the gratings have the same pitch P. In this example, two of the biases are centered on zero overlay (+d and −d). Additionally there are two biases (P/2+d and P/2−d) centered around the half pitch P/2 of the gratings. In terms of FIG. 7, the component gratings are in two pairs, having the forms of FIGS. 7(b)/7(c) and 7(f)/7(g).

As will be appreciated, four biases gives the potential to solve equations in four unknowns. The particular selection of four biases can be used in a particular modified version of step S6, to obtain overlay measurements that take are robust against not only noise but also higher harmonics as well as feature asymmetry variations across a substrate.

It will also be appreciated that the target 1000 in FIG. 10 is provided as an example only. The method described in the following could equally well be applied to targets with other numbers of biases. For example, suitable targets could comprise, without limitation, 2, 3, 5, 6, 7, 8 or more biases in one or both of the X and Y directions.

The provision of additional gratings bias increases the size of the targets and the number of measurements to be made. In terms of size, the target 1000 in FIG. 10 has component gratings with a basic dimension a transverse to the direction of periodicity, so that the composite target as a whole has overall dimension 2a by 4a as shown. Separate target structures can be provided for X and Y directions, as shown, or a composite grating target combining both X- and Y-direction gratings can be provided. Purely as examples for illustration, the targets have dimensions of a=4 µm or 5 µm. Such targets can all be read out for overlay also with the dark-field image-based technique known from the previous patent applications mentioned above and illustrated in FIGS. 4 and 5. This enables BGA-corrected overlay at small targets without stack-reconstruction. The calculations of modified step S6 do not need to be illustrated in detail for the skilled person. Although it is convenient for the calculation to use bias values that are symmetrical about OV=0 or OV=P/2, the bias schemes illustrated are not the only ones possible. The magnitude of the bias d chosen to suit the situation. In example embodiments, the different overlay bias values within each region span a range greater than 1%, 2% or 5% of a pitch of the periodic 5 structures (i.e. 2d/P >0.01, 0.02 or 0.05).

In the example target 1000 illustrated, X and Y gratings with each bias value are side-by-side, though that is not essential. The X and Y gratings are interspersed with one another in an alternating pattern, so that different X gratings are diagonally spaced, not side-by-side with one another, and Y gratings are diagonally spaced, not side-by-side with one another. This arrangement may help to reduce cross-talk between diffraction signals of the different biased gratings. The whole arrangement thus allows a compact target design, with good performance. While the component gratings in FIG. 10 are each square, composite grating targets with X and Y component gratings can also be made with elongate gratings. Examples are described for example in U.S. patent application publication no. US2012-0044470.

In a linearized form, equation 2 for calculating overlay for the target shown in FIG. 10 can be rewritten as follows:

$$OV = d\frac{(A_{0,pb} - A_{\pi,pb}) + (A_{0,nb} - A_{\pi,nb})}{(A_{0,pb} - A_{\pi,pb}) - (A_{0,nb} - A_{\pi,nb})} \quad (3)$$

where subscripts pb and nb refer to positive bias and negative bias respectively. Subscripts O and $\pi$ refer respectively to target structures where the bias is centered on zero overlay, i.e. "line on line" target structures, and where the bias is centered around the half pitch P/2, i.e. "line on trench" target structures. It is to be noted that the linearized form of equation 3 is used for exemplary purposes only. The non-linearized form of equation 3, as described in equation 2 above, could equally well be used, in particular if a better linearity response is needed for larger overlay values.

A is the asymmetry measurement, which is defined as: $A=I^+-I^-\cdot I^+$ and $I^-$ denote the intensities of the scattered +1 and −1 diffraction orders respectively. As is well known, the measured asymmetry is the difference between the measured intensities of the +1 and −1 diffraction orders. Thus, a substrate without any overlay errors or other imperfections will have an asymmetry measurement A that is equal to zero because the measured values for $I^+$ and $I^-$ will be identical. At this stage, for reasons explained in more detail in the following, it is helpful to define a symmetry measurement, as: $S=I^++I^-$.

While equations 2 and 3 are convenient for determining overlay, they rely on the assumption that the intensity asymmetry is substantially constant across a substrate. As an example, intensity asymmetry for "line on line" targets is assumed to be substantially identical to intensity asymmetry for "line on trench" targets. It has however been found that, in practice, this assumption does not necessarily hold true. As exemplified in FIG. 7(*d*) feature asymmetry in a "trench" of a bottom grating may vary from that of the lines of the same grating. This will in turn lead to a difference in the intensity asymmetry between a "line on line" and a "line on trench" target. In such a situation, using a single value for the intensity asymmetry in equations 2 and 3 will not yield an accurate calculation of the overlay.

In order to take intensity asymmetry variations into account, equation 3 can be modified as follows:

$$OV = d\frac{(\alpha_{0,pb}A_{0,pb} - \alpha_{\pi,pb}A_{\pi,pb}) + (\alpha_{0,nb}A_{0,nb} - \alpha_{\pi,nb}A_{\pi,nb})}{(\alpha_{0,pb}A_{0,pb} - \alpha_{\pi,pb}A_{\pi,pb}) - (\alpha_{0,nb}A_{0,nb} - \alpha_{\pi,nb}A_{\pi,nb})} \quad (4)$$

In this equation, each of the asymmetry measurements of equation 3 is multiplied by a corresponding weight factor $\alpha$. Each one of the weight factors represents a measure of intensity asymmetry within the respective one or more periodic structures.

By appropriate choice of each of the weight factors, it becomes possible to take into account variations of the intensity asymmetry due to feature asymmetry. Solution of equation 4 may be simplified by introducing one or more simplifications or assumptions. It should be noted that a number of specific assumptions may be envisaged, all of which are covered by the general principle of this disclosure.

In one example, equation 4 may be simplified in order to specifically take into account variations of the intensity asymmetry between "line on line" targets and "line on trench" targets. In equation terms, the following simplifications are performed: $\alpha_0 \equiv \alpha_{0,pb} = \alpha_{0,nb}$ and $\alpha_\pi \equiv \alpha_{\pi,pb} = \alpha_{\pi,nb}$. Equation 4 then becomes:

$$OV = d\frac{(\alpha_0 A_{0,pb} - \alpha_\pi A_{\pi,pb}) + (\alpha_0 A_{0,nb} - \alpha_\pi A_{\pi,nb})}{(\alpha_0 A_{0,pb} - \alpha_\pi A_{\pi,pb}) - (\alpha_0 A_{0,nb} - \alpha_\pi A_{\pi,nb})} \quad (5)$$

Solution of this equation is greatly simplified since only two weight factors need to be determined, as opposed to four in equation 4. In an embodiment, the weight factors should ideally be chosen such that:

$$\frac{\alpha_\pi}{\alpha_0} = \frac{K_{0,0}}{K_{0,\pi}} \quad (6)$$

where $K_{0,0}$ is the $K_0$ parameter for the "line on line" target, and $K_{0,\pi}$ is the $K_0$ parameter for the "line on trench" target. As described above, $K_0$ is normally used to describe the offset due to feature asymmetry. However, $K_0$ is additionally dependent on the programmed bias between the upper grating and the lower grating of the target. In other terms, the $K_0$ parameter for a "line on line" target may differ from the $K_0$ parameter for a "line on trench" target, even if the feature asymmetry for both targets is identical. This is because of the interference between radiation diffracted by the lower grating and the radiation diffracted by the upper grating, as will be described in more detail in the following. The resulting superposition of diffracted radiation is dependent on the relative positions of the upper grating and the lower grating.

The $K_0$ parameters cannot be determined experimentally, and it is therefore necessary to calculate the ratio between the weight factors. It will be appreciated, of course, that there are a number of ways to accomplish this, of which only a number of specific examples will be described in the following.

Figure 11:
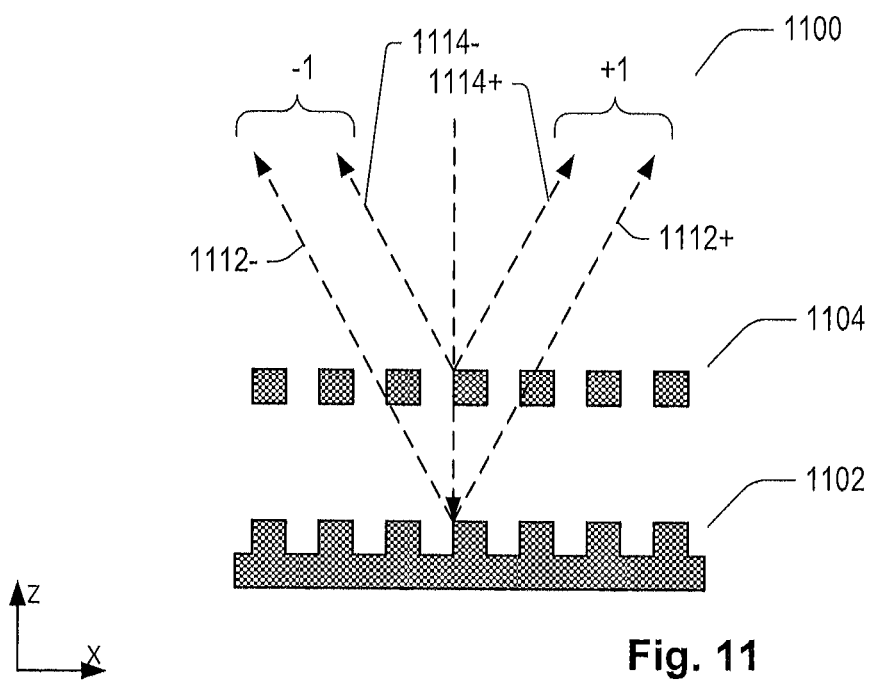
FIG. 11 illustrates a model of a grating used to calculate overlay according to an embodiment.

In a first example, the target structure is approximated by a simplified target structure, which will now be described in detail with reference to FIG. 11. In this example, a target structure 1100 comprises two periodic structures: a first grating 1102 in a lower layer and a second grating 1104 in an upper layer. As is known, gratings diffract incoming radiation into a plurality of specific directions known as diffraction orders. Each diffraction order comprises two distinct components that are arranged symmetrically around the 0 diffraction order, which corresponds to radiation reflected directly by the grating. For purposes of simplifying the approximation, only the 1st order radiation diffracted by both gratings is considered. The first grating 1102 diffracts the incoming radiation into two 1$^{st}$ order components 1112+,

1112−. Both components have a diffraction strength $R_a$. Similarly, the second grating 1104 diffracts the incoming radiation into two $1^{st}$ order components 1114+, 1114−. Both of these components have a diffraction strength $R_b$.

The intensity of a given diffraction order will be a superposition of the diffracted radiation from the first grating and the second grating. In equation terms, the intensity of a given diffraction order is:

$$I = |R_{a,eff} + R_{b,eff}|^2 \qquad (7)$$

The effective diffraction strength Rb of the second grating can be considered to be constant, i.e. $R_{b,eff} = R_b$. However, the effective diffraction strength of the first grating is defined as $R_{a,eff} = R_a e^{-j \cdot \varphi}$, wherein $\varphi$ is the phase difference between the radiation diffracted by the second grating and the radiation diffracted by the first grating.

In order to solve equation 6, the following variables are introduced:

$$r = \frac{R_a}{R_b}$$

$$x = r \cos \varphi$$

$$y = r \sin \varphi$$

$$x^2 + y^2 = r^2$$

It should be noted that the above variables apply to a "line on line" target structure. For a "line on trench" target structure, the signs of variables x and y are reversed.

Using the above, it is possible to derive a ratio between the weight factor for the line on line target structure $\alpha_0$ and the weight factor for the line on trench target structure $\alpha_\pi$ as follows:

$$\frac{\alpha_\pi}{\alpha_0} = \frac{r^2 + x}{r^2 - x} \qquad (8)$$

To solve this equation, it is necessary to determine values for x, y and r. These can be derived from the measured intensities of the $1^{st}$ order diffracted radiation by using the following equations:

$$\frac{S_{pb,0} + S_{nb,0} - S_{pb,\pi} - S_{nb,\pi}}{A_{pb,0} - A_{nb,0} - A_{pb,\pi} + A_{nb,\pi}} \cdot \left(2\pi \frac{d}{P}\right) \approx -\frac{x}{y} \qquad (9)$$

$$\frac{A_{pb,0} - A_{nb,0} - A_{pb,\pi} + A_{nb,\pi}}{S_{pb,0} + S_{nb,0} + S_{pb,\pi} + S_{nb,\pi}} \cdot \left(\frac{1}{4\pi} \cdot \frac{P}{d}\right) \approx -\frac{y}{1 + x^2 + y^2} \qquad (10)$$

Recall that A is defined as $A = I^+ - I^-$, and S is defined as $S = I^+ + I^-$. It is to be noted that equations 8 and 9 are quadratic, i.e. they have two separate solutions (one for r and one for 1/r). The solutions for a particular target structure are thus: $r = R_a/R_b$ and $1/r = R_b/R_a$. Both solutions are equally valid, but only one of them represents the actual situation. In other words, it is possible to determine the ratio between the diffraction strengths of the first and the second grating, but it is not possible to determine whether the upper grating or the lower grating has the largest diffraction strength. This mirrors the physical situation, where it is not possible to distinguish the radiation diffracted by the upper grating from that diffracted by the lower grating. As previously described, the measured intensity of the $1^{st}$ order diffracted radiation is a superposition of radiation diffracted by the lower grating and the upper grating. From the measured intensity, it is not possible to determine whether the intensity of the radiation diffracted by the lower grating is greater than the intensity of the radiation diffracted by the upper grating.

It is therefore necessary to determine which solution is to be used. In the following, a number of non-limiting exemplary ways of selecting a solution will be discussed. It will be appreciated that other ways of selecting one of the two solutions may be envisaged.

In a first example, a user simply selects which solution is to be used during configuration of the lithographic apparatus. The selection can for example be performed during a configuration step of a lithographic recipe that controls the lithographic patterning step and/or process steps in the device manufacturing process.

In another example, the solution to be used is selected based on one or more criteria. These criteria can be evaluated automatically by the lithographic apparatus. For example, the lithographic apparatus may evaluate the two solutions based on one or more specific criteria during an optimization step of a lithographic recipe. In one particular example, the criterion used in the evaluation is the wavelength consistency (i.e. color variation due to feature asymmetry). During the evaluation, the wavelength consistency is determined for both solutions to the equation. The solution that has the smallest color variation is then selected.

In yet another example, an absolute calibration can be carried out to determine the diffraction efficiency with respect to the radiation intensity. Such a calibration would provide additional data needed to determine which of the two possible solutions is to be used.

For illustrative purposes, two exemplary solutions to equation 6, which describes the ratio between the weight factor $\alpha_0$ for the line on line target structure and the weight factor $\alpha_\pi$ for the line on trench target structure, will now be discussed.

The first exemplary solution to equation 6 is a boundary case where $r \approx 1$, i.e. the diffraction strength of the lower grating is substantially identical to the diffraction strength of the upper grating. In this instance, the ratio of the weight factors are identical to the ratio of the diffraction efficiencies DE of both target structures:

$$\frac{\alpha_\pi}{\alpha_0} = \frac{DE_0}{DE_\pi} \qquad (11)$$

The diffraction efficiencies $DE_0$, for the "line on line" target structure, and $DE_\pi$, for the "line on trench" target structure, is calculated by determining the average intensity of both the +1 and −1 diffraction order for the "line on line" target structure and the "line on trench" target structure respectively.

The second exemplary solution is a second boundary case, wherein $r \ll 1$, i.e. where the diffraction strength of one grating in a target structure is significantly larger than the diffraction strength of the other grating in the target structure. In terms of the diffraction efficiencies, the solution becomes:

$$\frac{\alpha_\pi}{\alpha_0} = \frac{3 \cdot DE_0 + DE_\pi}{3 \cdot DE_\pi + DE_0} \qquad (12)$$

As described above, a linear approximation of equation 2 has been used in the above examples. When using this approximation, the $K_1$ values for both the "line on line" target structure and the "line on trench" target structure are identical. This allows the terms for the diffraction efficiencies $DE_0$ and $DE_\pi$ to be replaced by corresponding terms for stack sensitivity SS as follows: $DE_0=1/SS_0$ and $DE_\pi=1/SS_\pi$.

Figure 12:
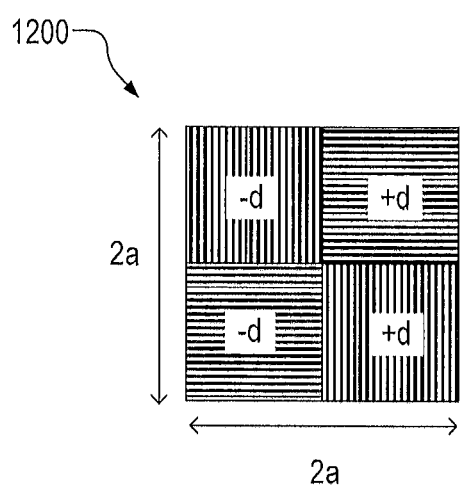
FIG. 12 illustrates a composite grating target having a bias scheme according to an embodiment.

FIG. 12 shows a second exemplary target 1200 which can be used to implement overlay measurement which takes into account variations in feature asymmetry. The target of FIG. 12 has two gratings periodic in X and two gratings periodic in Y, so that overlay in both directions can be measured. In this example, the biases are centered on zero overlay (+d and −d).

For this target, equation 4 reduces to:

$$OV = d\frac{(\alpha_{pb}A_{pb}) + (\alpha_{nb}A_{nb})}{(\alpha_{pb}A_{pb}) - (\alpha_{nb}A_{nb})} \quad (13)$$

Equation 12 can be solved in a way analogous to that used to solve equation 4 as described above.

In the above examples, only targets of a single type, i.e. with a particular number of target structures, are used to implement the method of the disclosure. For example, it is possible to exclusively use targets with four different biases. In this fashion, it can be ensured that asymmetry is corrected at every point.

Alternatively, it is possible to utilize a number of different target types, with different numbers of target structures. In one example, a 4-bias target is used during an initial measurement, such as during setup of the lithographic recipe or during an optimization step. During the initial measurement, the overlay error is determined based on the 4-bias target. During subsequent measurements, measurements are performed on a 2-bias target. This has the advantage that measurement targets can be kept smaller, since a 2-bias target takes up less space on a substrate than a 4-bias target. This allows targets to be placed between in product areas and/or increases the product yield of a particular substrate. Additionally, using a target with fewer targets structures reduces the required time for performing measurements, which may also increase production speed of the lithographic apparatus.

As described above, equation (4) enables the elimination or reduction of the contribution of intensity asymmetry to overlay. In the following, an exemplary method for eliminating or reducing the contribution of phase asymmetry to overlay will be described. It will, of course, be appreciated that this method is usable in addition to, or alternatively to, any of the above-described methods for eliminating or reducing the contribution of intensity asymmetry to overlay.

In order to take into account the phase asymmetry, a second weight factor $W(\lambda)$ can be included in equation (3) above. The second weight factor is dependent on the wavelength of the radiation used. In the following, the second weight factor will be referred to interchangeably as Wand "second weight factor". When W is included, equation (3) is rewritten as:

$$OV = d\frac{W(A_{0,pb} + A_{0,nb}) - (A_{\pi,pb} + A_{\pi,nb})}{W(A_{0,pb} - A_{0,nb}) - (A_{\pi,pb} - A_{\pi,nb})} \quad (14)$$

As can be seen, the second weight factor is only included for asymmetry measurements for "line on line" target structures, and therefore weights the "line on line" target structures with respect to "line on trench" target structures. It will be appreciated that the second weight factor could, in principle, be equally well applied to the asymmetry measurements for the "line on trench" target structures.

Figure 13:
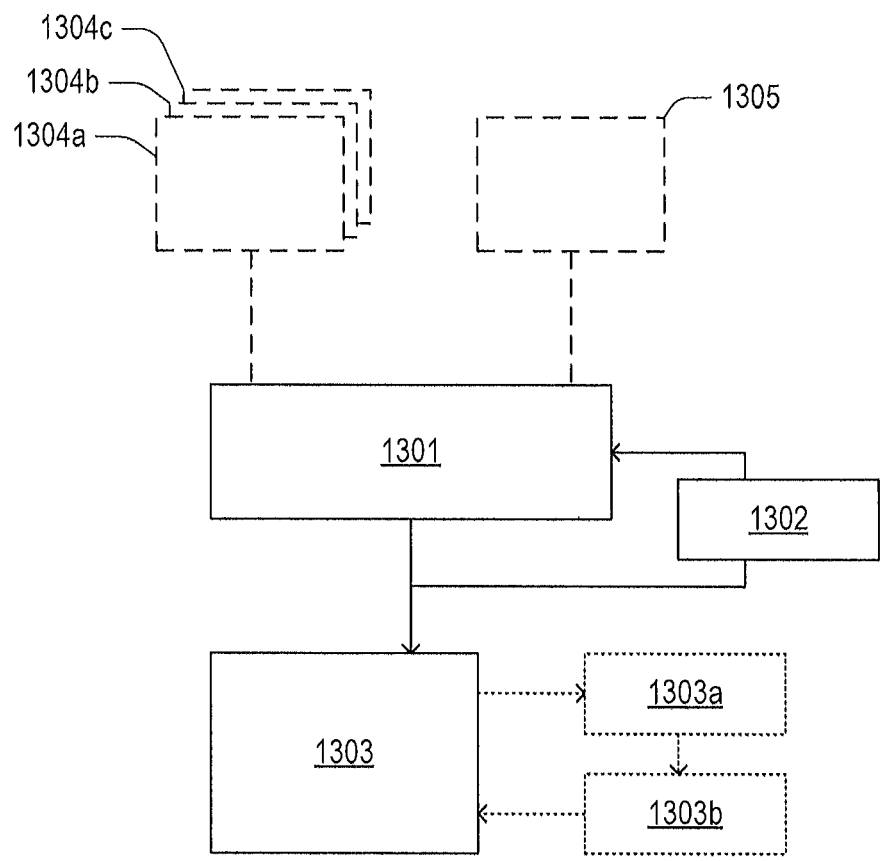
FIG. 13 is a flowchart of a method in accordance with an embodiment.

The second weight factor W can be determined in any convenient way. One exemplary method therefor will now be described with reference to FIG. 13. It will be appreciated that the method described in the examples that follow is exemplary only, and that other exemplary methods may be envisaged.

In a first step 1301, an overlay value based on the overall asymmetry measurement 1304a and a second weight factor 1305 is determined. In this example, the overall asymmetry measurement for at least one of the target structures is weighted by the second weight factor as shown in equation (14) above.

The second weight factor may have any suitable initial value. In one example, the initial value for the second weight factor is 1. In another example, the initial value for the second weight factor may be chosen randomly. In another example, the initial value of W is set based on data obtained previously (e.g. statistical or experimental data).

As described above, the overlay value OV is based on the overall asymmetry measurements carried out on selected targets. The targets may be selected in a convenient way, e.g. randomly or according to one or more criteria that can either be determined automatically or by a user. In an example, a single overlay target with a plurality of target structures is used. In another example, two overlay targets with a plurality of target structures may be selected. In principle, any number of overlay targets may be selected.

It will of course be realized that a plurality of overall asymmetry measurements (exemplified by references 1304b, 1304c in FIG. 13) may be used in addition to the first asymmetry measurement 1304a. In an example, one or more target structures are illuminated using a plurality of radiation wavelengths. The specific wavelengths may be chosen in any suitable fashion. In one example, the radiation may comprise radiation in the visible spectrum.

In this example, asymmetry measurements have been performed for each of the radiation wavelengths as described above. The resulting plurality of overall asymmetry measurements are then used to calculate overlay values representing each of the radiation wavelengths, as described above. In other terms, a plurality of overlay values that correspond to a plurality of values of the second weight factor are derived for each of the radiation wavelengths.

The asymmetry measurements may be carried out at any convenient time. For example, the measurements may be carried out in advance of or remotely from method step 1301.

In a second step 1302, the first method step is repeated for a plurality of values of the second weight factor. Any suitable number of values for the second weight factor may be used. The second weight factor values may in one example be chosen randomly. In another example, the values are chosen from a plurality of predefined values. In a further example, the values for the second weight factor are determined based on statistical or historical data relating to the lithographic apparatus.

In a third step 1303, one of the plurality of values of the second weight factor is selected based on the determined overlay values and one or more reference values. It will be appreciated that a number of selection criteria may be employed as part of the third step.

In an example, the step of selection comprises two sub-steps. In a first sub-step 1303a, a difference between each of the plurality of determined overlay values and the one or more reference values is derived. In a second sub-step 1303b, the value of the second weight factor corresponding to the specific overlay value having the smallest derived difference from the one or more reference values is selected.

The one or more reference values used to determine the difference in sub-step 1303b may take any suitable form. In an example, the one or more reference values comprise a reference data set. In a specific example, the reference data set comprises previously obtained data (e.g. previously obtained experimental data or statistically derived data). In another example, the reference data set comprises data obtained from a calibration substrate.

In another example, the reference values comprise overlay values corresponding to a plurality of different illumination wavelengths. As explained above, in some examples a plurality of radiation wavelengths are used, and overlay values calculated for each wavelength. In one such example, the difference is derived between a plurality of determined overlay values of a first overlay data set corresponding to a first illumination wavelength and each of the plurality of determined overlay values of a second overlay data set corresponding to a second illumination wavelength. In this fashion, it is possible to minimize the variation in overlay error that is dependent on the radiation wavelength.

The second sub-step 1303b may in some examples be repeated for a plurality of additional overlay data sets. In one such example, the second sub-step is repeated for a plurality of additional overlay data sets, each of which corresponding to a specific illumination wavelength, thereby to derive a plurality of determined differences. In this example, an empirical evaluation of the plurality of determined differences is carried out, and the additional weight factor value with the lowest cumulative difference value is selected.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed. Further, pitch P of the metrology target is close to the resolution limit of the optical system of the scatterometer, but may be much larger than the dimension of typical product features made by lithographic process in the target portions C. In practice the lines and/or spaces of the overlay gratings may be made to include smaller structures similar in dimension to the product features.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, an embodiment can be implemented by the provision of updated computer program products for causing a processor to perform the modified step S6 and so calculate overlay error or other parameters with reduced sensitivity to feature asymmetry.

The program may optionally be arranged to control the optical system, substrate support and the like to perform the steps S2-S5 for measurement of asymmetry on a suitable plurality of target structures. The program can update the metrology recipe for measurement of further substrates (S13). The program may be arranged to control (directly or indirectly) the lithographic apparatus for the patterning and processing of further substrates (step S14).

Further embodiments are provided in below numbered clauses:

1. A method of measuring a parameter of a lithographic process, the method comprising:

(a) using the lithographic process to form a target with a plurality of target structures on a substrate, each target structure comprising overlaid periodic structures and each having a known overlay bias;

(b) illuminating the target structures and detecting radiation scattered by each target structure to obtain for that target structure a measurement representing an overall asymmetry that includes contributions due to (i) the known overlay bias, (ii) overlay performance of the lithographic process, (iii) feature asymmetry within one or more of the periodic structures;

(c) using the overall asymmetry measurements for a plurality of target structures to calculate a measure of the overlay error, the calculation being performed using the known overlay bias values and the overall asymmetry measurements, wherein each of the overall asymmetry measurements is weighted by a corresponding weight factor, each one of the weight factors representing a measure of feature asymmetry within the respective one or more periodic structures.

2. A method according to clause 1, wherein at least four different values of overlay bias are used, comprising at least two bias values falling within a first region centered on zero bias and at least two bias values falling within a second region centered on P/2 where P is the pitch of the periodic structure.

3. A method according clause 2, wherein the bias values falling within the first region centered on zero bias are weighted by a first weight factor, and wherein the bias values falling within the second region centered on P/2 are weighted by a second weight factor.

4. A method according to clause 3, comprising determining a ratio between the first weight factor and the second weight factor based on the overall asymmetry measurements, wherein the ratio is based on the feature asymmetry of the first region and the feature asymmetry of the second region.

5. A method according to any preceding clause, wherein two different values of overlay bias are used on at least one target structure of the plurality of target structures, the two bias values falling within the half period centered on zero bias.

6. A method according to any preceding clause, wherein each target structure comprises a first periodic structure and a second periodic structure, and wherein each of the corresponding weight factors is based on a ratio between a first diffraction efficiency of the first periodic structure and a second diffraction efficiency of the second periodic structure of the target structure.

7. A method according to any of clauses 1 to 6, further comprising a step (d) of using the measure of overlay error obtained in step (c) to control the performance of step (a) in subsequent performances of the method.
8. A method according to any of clauses 1 to 6, further comprising a step (e) of using the measure of overlay error obtained in step (c) to control the performance of step (b) in subsequent performances of the method.
9. A method according to any of clauses 2 to 8, wherein the step of using the overall asymmetry measurements comprises:
determining an overlay value based on the overall asymmetry measurements and a second weight factor, wherein the overall asymmetry measurement for at least one of the target structures is weighted by the second weight factor, and wherein the second weight factor has a specific value;
repeating the determining step for a plurality of values of the second weight factor; and
selecting one of the plurality of values of the second weight factor based on the determined overlay values and one or more reference values.
10. A method according to clause 9, further comprising weighting the overall asymmetry for the at least one target structure having an overlay bias value falling within the first region.
11. A method according to clause 9 or clause 10, wherein the step of selecting comprises:
deriving a difference between each of the plurality of determined overlay values and each of the one or more reference values; and
selecting the value of the second weight factor corresponding to the determined overlay value having the smallest derived difference from the one or more reference values.
12. A method according to any of clauses 9 to 11, wherein the step of illuminating comprises illuminating the target structures using a plurality of radiation wavelengths to create a plurality of overlay data sets, each overlay data set comprising a plurality of determined overlay values corresponding to a specific illumination wavelength.
13. A method according to clause 12, wherein the step of deriving comprises
deriving the difference between each of the plurality of determined overlay values of a first overlay data set corresponding to a first illumination wavelength and each of the plurality of determined overlay values of a second overlay data set corresponding to a second illumination wavelength.
14. A method according to clause 13, comprising repeating the deriving step for a plurality of overlay data sets corresponding to a plurality of specific illumination wavelengths.
15. An inspection apparatus arranged to perform the method of any of clauses 1 to 14.
16. An inspection apparatus according to clause 15, further comprising:
a support for a substrate having a plurality of target structures thereon, each target structure comprising overlaid periodic structures and each having a known overlay bias;
an optical system for illuminating the target structures and detecting radiation scattered by each target structure to obtain for that target structure a measurement representing an overall asymmetry that includes contributions due to (i) the known overlay bias, (ii) overlay performance of the lithographic process, (iii) feature asymmetry within one or more of the periodic structures;
a processor arranged to use the overall asymmetry measurements for a plurality of target structures to calculate a measure of the overlay error, the calculation being performed using the known overlay bias values and the overall asymmetry measurements,
wherein each of the overall asymmetry measurements is weighted by a corresponding weight factor, each one of the weight factors representing a measure of feature asymmetry within the respective one or more periodic structures.
17. An inspection apparatus according to clause 16, wherein at least four different values of overlay bias are used, comprising at least two bias values falling within a first region centered on zero bias and at least two bias values falling within a second region centered on P/2 where P is the pitch of the periodic structure.
18. An inspection apparatus according to clause 17, wherein the bias values falling within the first region centered on zero bias are weighted by a first weight factor, and wherein the bias values falling within the second region centered on P/2 are weighted by a second weight factor.
19. An inspection apparatus according to clause 18, wherein the processor is arranged to determine a ratio between the first weight factor and the second weight factor based on the overall asymmetry measurements, wherein the ratio is based on the feature asymmetry of the first region and the feature asymmetry of the second region.
20. An inspection apparatus according to any of clauses 16 to 19, wherein two different values of overlay bias are used on at least one target structure of the plurality of target structures, the two bias values falling within the half period centered on zero bias.
21. An inspection apparatus according to any of clauses 16 to 20, wherein each target structure comprises a first periodic structure and a second periodic structure, and wherein each of the corresponding weight factors is based on a ratio between a first diffraction efficiency of the first periodic structure and a second diffraction efficiency of the second periodic structure of the target structure.
22. An inspection apparatus according to any of clauses 16 to 21, wherein the processor is additionally arranged to:
determine an overlay value based on the overall asymmetry measurements and a second weighting factor, wherein the overall asymmetry measurement for at least one of the target structures is weighted by the second weight factor, and wherein the second weight factor has a specific value;
repeat the determining step for a plurality of values of the second weight factor; and
select one of the plurality of values of the second weight factor based on the determined overlay values and one or more reference values.
23. An inspection apparatus according to clause 22, wherein the processor is arranged to weight the overall asymmetry for the at least one target structure having an overlay bias value falling within the first region.
24. An inspection apparatus according to clause 22 or clause 23, wherein the processor is arranged to, during selection step:
derive a difference between each of the plurality of determined overlay values and the one or more reference values; and
select the value of the second weight factor corresponding to the determined overlay value having the smallest derived difference from the one or more reference values.
25. An inspection apparatus according to any of clauses 22 to 24, wherein the optical system is arranged to illuminate the target structures using a plurality of radiation wavelengths, and wherein the processor is arranged to obtain a plurality of overlay data sets, each overlay data set comprising a plurality of determined overlay values corresponding to a specific illumination wavelength.

26. An inspection apparatus according to clause 25, wherein the processor is arranged to, during the deriving step, derive the difference between each of the plurality of determined overlay values of a first overlay data set corresponding to a first illumination wavelength and each of the plurality of determined overlay values of a second overlay data set corresponding to a second illumination wavelength.

27. An inspection apparatus according to clause 26, wherein the processor is arranged to repeat the deriving step for a plurality of overlay data sets corresponding to a plurality of specific illumination wavelengths.

28. A substrate for use in a method according to any of clauses 1 to 14, the substrate having a plurality of target structures formed thereon by a lithographic process, each target structure comprising overlaid periodic structures and each having a known overlay bias.

29. A substrate according to clause 28, wherein at least four target structures are provided and wherein the values of overlay bias for the target structures comprise at least two bias values falling within a first region centered on zero bias and at least two bias values falling within a second region centered on P/2 where P is the pitch of the periodic structure.

30. A substrate according to clause 28 or clause 29, wherein two different values of overlay bias are used on at least one target structure of the plurality of target structures, the two bias values falling within the half period centered on zero bias.

31. A patterning device for use in forming a substrate according to any of clauses 28 to 30.

32. A computer program product comprising machine-readable instructions for causing a processor to perform the processing step (c) of a method as clauseed in any of clauses 1 to 14.

33. A computer program product according to clause 32 further comprising instructions for causing a processor to perform the step (d) of a method as clauseed in clause 7.

34. A computer program product according to clause 32 or clause 33 further comprising instructions for causing a processor to perform the step (e) of a method as clauseed in clause 8.

35. A lithographic system comprising:
a lithographic apparatus comprising:
an illumination optical system arranged to illuminate a pattern, and
a projection optical system arranged to project an image of the pattern onto a substrate; and
an inspection apparatus according to any of clauses 15 to 27, wherein the lithographic apparatus is arranged to use one or more parameters calculated by the inspection apparatus in applying the pattern to further substrates.

36. A method of manufacturing devices wherein a device pattern is applied to a series of substrates using a lithographic process, the method including inspecting at least one periodic structure formed as part of or beside the device pattern on at least one of the substrates using a method according to any of clauses 1 to 14 and controlling the lithographic process for later substrates in accordance with the result of the inspection method.

Although specific reference may have been made above to the use of embodiments in the context of optical lithography, it will be appreciated that embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
illuminating a plurality of target structures of a target formed by a lithographic process on a substrate, each target structure comprising overlaid periodic structures and each having a known overlay bias, and detecting radiation scattered by each target structure to obtain for that target structure a measurement representing an overall asymmetry that includes contributions due to (i) the known overlay bias, (ii) overlay performance of the lithographic process, and (iii) feature asymmetry within one or more of the periodic structures; and
using the overall asymmetry measurements for the plurality of target structures to calculate a measure of overlay error, the calculation being performed using the known overlay bias values and the overall asymmetry measurements,
wherein each of the overall asymmetry measurements is weighted by a corresponding weight factor, each one of the weight factors representing a measure of feature asymmetry within the respective one or more periodic structures.

2. The method of claim 1, wherein at least four different values of overlay bias are used, comprising at least two bias values falling within a first region centered on zero bias and at least two bias values falling within a second region centered on P/2 where P is the pitch of at least one of the periodic structures.

3. The method of claim 2, wherein the bias values falling within the first region centered on zero bias are weighted by a first weight factor, and wherein the bias values falling within the second region centered on P/2 are weighted by a second weight factor.

4. The method of claim 3, comprising determining a ratio between the first weight factor and the second weight factor based on the overall asymmetry measurements, wherein the ratio is based on the feature asymmetry of the first region and the feature asymmetry of the second region.

5. The method of claim 1, wherein two different values of overlay bias are used on at least one target structure of the plurality of target structures, the two bias values falling within a half period of at least one of the periodic structures, centered on zero bias.

6. The method of claim 1, wherein each target structure comprises a first periodic structure and a second periodic structure, and wherein each of the corresponding weight factors is based on a ratio between a first diffraction efficiency of the first periodic structure and a second diffraction efficiency of the second periodic structure.

7. The method of claim 1, further comprising using the calculated measure of overlay error to control using the lithographic process to form a target with a plurality of target structures on a substrate, each target structure comprising overlaid periodic structures and each having a known overlay bias, for subsequent performances of the method.

8. The method of claim 1, further comprising using the calculated measure of overlay error to control the illuminating of target structures and detecting radiation scattered by each target structure to obtain for that target structure a measurement representing an overall asymmetry that includes contributions due to (i) the known overlay bias, (ii) overlay performance of the lithographic process, and (iii) feature asymmetry within one or more of the periodic structures, for subsequent performances of the method.

9. The method of claim 2, wherein the using the overall asymmetry measurements comprises:
determining an overlay value based on the overall asymmetry measurements and a second weight factor, wherein the overall asymmetry measurement for at least one of the target structures is weighted by the second weight factor, and wherein the second weight factor has a specific value;
repeating the determining for a plurality of values of the second weight factor; and
selecting one of the plurality of values of the second weight factor based on the determined overlay values and one or more reference values.

10. The method of claim 9, further comprising weighting the overall asymmetry for the at least one target structure having an overlay bias value falling within the first region.

11. The method of claim 9, wherein the selecting comprises:
deriving a difference between each of the plurality of determined overlay values and each of the one or more reference values; and
selecting the value of the second weight factor corresponding to the determined overlay value having the smallest derived difference from the one or more reference values.

12. The method of claim 11, wherein the deriving comprises deriving the difference between each of the plurality of determined overlay values of a first overlay data set corresponding to a first illumination wavelength and each of the plurality of determined overlay values of a second overlay data set corresponding to a second illumination wavelength.

13. The method of claim 12, comprising repeating the deriving for a plurality of overlay data sets corresponding to a plurality of specific illumination wavelengths.

14. The method of claim 9, wherein the illuminating comprises illuminating the target structures using a plurality of radiation wavelengths to create a plurality of overlay data sets, each overlay data set comprising a plurality of determined overlay values corresponding to a specific illumination wavelength.

15. A method of manufacturing devices wherein a device pattern is applied to a series of substrates using a lithographic process, the method including inspecting at least one periodic structure formed as part of or beside the device pattern on at least one of the substrates using the method according to claim 1 and controlling the lithographic process for later substrates in accordance with the result of the method of claim 1.

16. An inspection apparatus comprising:
a support configured to support a substrate having a plurality of target structures thereon, each target structure comprising overlaid periodic structures and each having a known overlay bias;
an optical system configured to illuminate the target structures and detect radiation scattered by each target structure to obtain for that target structure a measurement representing an overall asymmetry that includes contributions due to (i) the known overlay bias, (ii) overlay performance of the lithographic process, and (iii) feature asymmetry within one or more of the periodic structures;
a processor configured to use the overall asymmetry measurements for the plurality of target structures to calculate a measure of overlay error, the calculation being performed using the known overlay bias values and the overall asymmetry measurements,
wherein each of the overall asymmetry measurements is weighted by a corresponding weight factor, each one of the weight factors representing a measure of feature asymmetry within the respective one or more periodic structures.

17. A lithographic system comprising:
a lithographic apparatus comprising:
an illumination optical system arranged to illuminate a pattern, and
a projection optical system arranged to project an image of the pattern onto a substrate; and
the inspection apparatus according to claim 16,
wherein the lithographic apparatus is arranged to use one or more parameters calculated by the inspection apparatus in applying the pattern to further substrates.

18. A non-transitory computer program product comprising machine-readable instructions for causing a hardware processor to at least:
cause, or have caused, illumination of a plurality of target structures of a target formed by a lithographic process on a substrate, each target structure comprising overlaid periodic structures and each having a known overlay bias, and detection of radiation scattered by each target structure to obtain for that target structure a measurement representing an overall asymmetry that includes contributions due to (i) the known overlay bias, (ii) overlay performance of the lithographic process, and (iii) feature asymmetry within one or more of the periodic structures; and
use the overall asymmetry measurements for a plurality of target structures to calculate a measure of overlay error, the calculation performed using known overlay bias values and the overall asymmetry measurements, wherein each of the overall asymmetry measurements is weighted by a corresponding weight factor, each one of the weight factors representing a measure of feature asymmetry within the respective one or more periodic structures.

19. The computer program product of claim 18, wherein at least four different values of overlay bias are used, comprising at least two bias values falling within a first region centered on zero bias and at least two bias values falling within a second region centered on P/2 where P is the pitch of at least one of the periodic structures.

20. The computer program product of claim 19, wherein the bias values falling within the first region centered on zero bias are weighted by a first weight factor, and wherein the bias values falling within the second region centered on P/2 are weighted by a second weight factor.

21. The computer program product of claim 18, wherein two different values of overlay bias are used on at least one target structure of the plurality of target structures, the two bias values falling within the half period centered on zero bias.

22. The computer program product of claim 18, wherein each target structure comprises a first periodic structure and a second periodic structure, and wherein each of the corresponding weight factors is based on a ratio between a first diffraction efficiency of the first periodic structure and a second diffraction efficiency of the second periodic structure.

23. The computer program product of claim 18, wherein the instructions are further configured to use the calculated measure of overlay error to control using the lithographic process and/or to control illuminating the target structures and detecting radiation scattered by each target structure.

* * * * *